(12) United States Patent
Schürz et al.

(10) Patent No.: US 7,726,629 B2
(45) Date of Patent: Jun. 1, 2010

(54) LIFTING APPARATUS AND INJECTION VALVE

(75) Inventors: Willibald Schürz, Pielenhofen (DE); Martin Simmet, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 8 days.

(21) Appl. No.: 11/575,154

(22) PCT Filed: Sep. 6, 2005

(86) PCT No.: PCT/EP2005/054376

§ 371 (c)(1), (2), (4) Date: Mar. 13, 2007

(87) PCT Pub. No.: WO2006/029973

PCT Pub. Date: Mar. 23, 2006

(65) Prior Publication Data

US 2008/0210788 A1    Sep. 4, 2008

(30) Foreign Application Priority Data

Sep. 13, 2004   (DE) .................... 10 2004 044 153

(51) Int. Cl.
*F16K 31/02* (2006.01)
(52) U.S. Cl. .............. 251/129.06; 239/102.2; 239/584
(58) Field of Classification Search ........... 251/129.06; 239/102.1, 102.2, 124, 584
See application file for complete search history.

(56) References Cited

U.S. PATENT DOCUMENTS

| | | | |
|---|---|---|---|
| 4,216,584 A * | 8/1980 | Meissner et al. ........... 33/784 |
| 4,725,002 A | 2/1988 | Trachte | |
| 5,779,149 A | 7/1998 | Hayes, Jr. ............... 239/124 |
| 6,172,445 B1 | 1/2001 | Heinz et al. ............. 310/328 |
| 6,313,568 B1 | 11/2001 | Sullivan et al. .......... 310/346 |
| 6,333,586 B1 * | 12/2001 | Polach et al. ........... 310/328 |
| 6,367,453 B1 * | 4/2002 | Igashira et al. .......... 123/467 |

(Continued)

FOREIGN PATENT DOCUMENTS

DE   199 28 780 A1   4/2001

(Continued)

OTHER PUBLICATIONS

International Search Report and Written Opinion for International Application No. PCT/EP2005/054376 (6 pages), Nov. 24, 2005.

(Continued)

*Primary Examiner*—John K Fristoe, Jr.
(74) *Attorney, Agent, or Firm*—King & Spalding L.L.P.

(57) ABSTRACT

A lifting apparatus comprising a counter bearing (8) provided with a first recess (9), having a conical bearing surface (10), and an actuator unit comprising an actuator (6) whose axial extension is dependent upon an actuating signal. The actuator unit has a shoulder which is formed in an area of the actuator unit which faces away from the output and which has a domed surface (11). The domed surface (11) of the actuator unit rests upon the conical bearing surface (10) of the counter-bearing (8). The injection valve comprises said lifting device and an injector needle which is coupled to the lifting apparatus on the output side thereof and which prevents the flow of fluid through the injector nozzle when closed and otherwise releases it.

7 Claims, 3 Drawing Sheets

U.S. PATENT DOCUMENTS

| | | | |
|---|---|---|---|
| 6,467,460 B1 * | 10/2002 | Stier | 123/498 |
| 6,661,159 B2 | 12/2003 | Yamada | 310/328 |
| 6,729,554 B2 * | 5/2004 | Katsura et al. | 239/88 |
| 6,758,409 B1 | 7/2004 | Itoh | 239/102.2 |
| 6,807,950 B2 * | 10/2004 | Boss et al. | 123/506 |
| 6,840,466 B2 * | 1/2005 | Igashira et al. | 239/585.1 |
| 2004/0046138 A1 | 3/2004 | Stein et al. | 251/129.06 |
| 2006/0278837 A1 | 12/2006 | Kienzler et al. | 251/129.06 |

FOREIGN PATENT DOCUMENTS

| | | |
|---|---|---|
| DE | 199 53 562 A1 | 5/2001 |
| DE | 100 57 495 A1 | 5/2002 |
| DE | 101 23 218 A1 | 11/2002 |
| DE | 101 42 798 A1 | 4/2003 |
| DE | 10142798 A1 | 4/2003 |
| DE | 102 12 152 A1 | 12/2003 |
| JP | 62067276 A | 3/1987 |
| JP | 6264110 A | 9/1994 |
| WO | 98/25060 A1 | 6/1998 |
| WO | WO 2004066404 A1 | 8/2004 |
| WO | 2004/104404 A1 | 12/2004 |

OTHER PUBLICATIONS

Japanese Office Action, Japanese applicaton No. 2007-530704, 10 pages, Oct. 16, 2009.

* cited by examiner

LIFTING APPARATUS AND INJECTION VALVE

CROSS-REFERENCE TO RELATED APPLICATIONS

This application is a U.S. national stage application of International Application No. PCT/EP2005/054376 filed Sep. 6, 2005, which designates the United States of America, and claims priority to German application number DE 10 2004 044 153.7 filed Sep. 13, 2004, the contents of which are hereby incorporated by reference in their entirety.

TECHNICAL FIELD

The invention relates to a lifting apparatus, with an actuator unit and a counter bearing. Furthermore, the invention relates to an injection valve, comprising the lifting apparatus and a nozzle needle.

BACKGROUND

Injection valves, especially for combustion engines in motor vehicles, must fulfill high precision requirements in order to enable low-emission and resource sparing operation of the combustion engine. If a lifting apparatus of the injection valve consists for instance of a piezoactuator, then the precision requirements are especially high along the power train, since piezoactuators have, in principle, only a small lift of a few micrometers for example. Friction and elastic areas along the power train can reduce the lift.

SUMMARY

The object of the invention is thus to develop a lifting apparatus, with which a lift can be transferred reliably. Furthermore, the object of the invention is to develop an injection valve, in which the lifting of a nozzle needle is reliable.

According to an embodiment, a lifting apparatus may comprise a counter bearing comprising a first recess having a conical bearing surface, and an actuator unit, comprising an actuator, an axial extension of which is dependent on an actuating signal, the actuator unit having a shoulder formed in an area of the actuator unit facing away from the output, the shoulder having a domed surface, and the domed surface of the actuator unit rests upon the conical bearing surface of the counter bearing, wherein the lifting apparatus has a guide bush with a continuous recess, in which the actuator unit is guided and in which the actuator unit is arranged in such a way that it can be moved axially and the guide bush is made of sintered bronze with molybdenum sulfide.

BRIEF DESCRIPTION OF THE DRAWINGS

Examples of the invention are explained subsequently, with the help of schematic drawings. They show.

Figure 1:
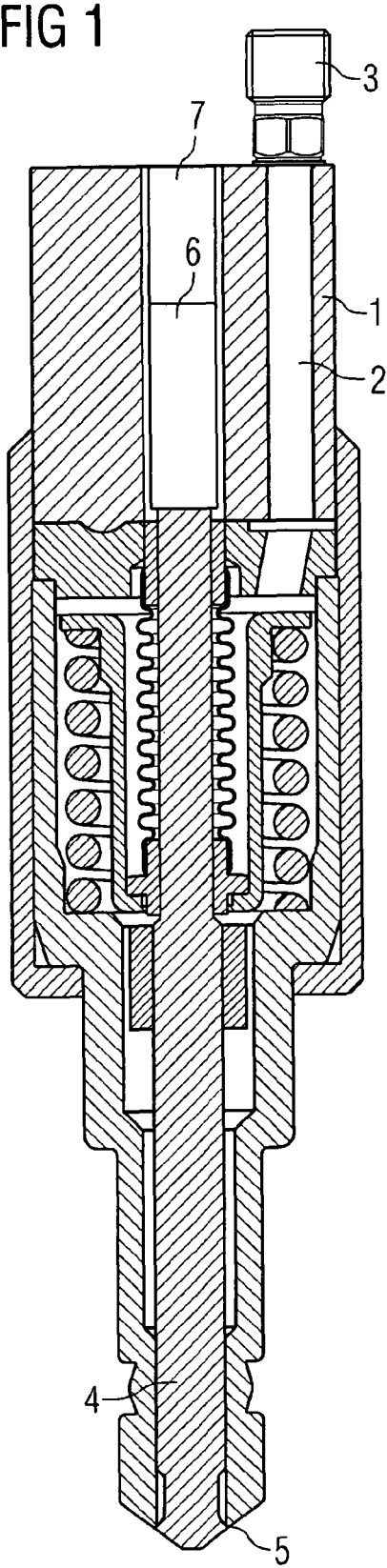
FIG. 1: an injection valve

Elements of similar construction or function are provided with the same reference signs throughout the figures.

DETAILED DESCRIPTION

According to an embodiment, a lifting apparatus comprises a counter bearing and an actuator unit. The counter bearing can be provided with a first recess, having a conical bearing surface. The actuator unit may comprise an actuator, the axial extension of which is dependent upon an actuating signal. Further, the actuator unit may have a shoulder which is formed in an area of the actuator unit that faces away from the output, and has a domed surface. The domed surface of the actuator unit may rest upon the conical bearing surface of the counter bearing. This has the advantage that the actuator unit can be aligned in its angular position during mounting or even during operation, and can be rotated in the counter bearing, thereby reducing the friction. According to an embodiment, the domed surface can be designed as spherical or rounded in shape. According to an embodiment, the domed surface of the actuator unit can preferably be designed in such a way that a line-shaped contact is formed between the domed surface and the conical bearing surface, by resting the domed surface against the conical bearing surface of the counter bearing. This is advantageous in that power transmission can take place in a very reliable way, and lift losses, due to the deflection of the contact through a deformation of the domed surface or the conical bearing surface, are smaller. Such a contact enables a low-loss transmission of lift. The deformation can occur due to contact pressure which acts on the surfaces adjacent to each other in contact.

According to an embodiment, an elastic element can be provided, which may be designed in such a way and may work in such a way together with the actuator unit as to keep the domed surface in contact with the conical bearing surface. This has the advantage that the deflection of contact can be further reduced by preloading the contact between the domed surface and the conical bearing surface with the help of the elastic element. Lift losses can thus be reduced. The elastic element allows alignment of the angular position or a rotary alignment of the actuator unit in the counter bearing. The elastic element reduces the danger of the actuator unit slipping into the counter bearing accidentally. This can simplify the mounting of the lifting apparatus and can prevent damage to the actuator unit or the counter bearing.

According to an embodiment, the actuator unit may comprise a neck element that stretches through a second recess, which is formed in the counter bearing and penetrates it. According to an embodiment, the neck element can be provided with a head element on the side of the counter bearing, which faces away from the actuator unit. According to an embodiment, the elastic element can be arranged between the head element and the counter bearing. This has the advantage that the actuator unit is suspended on the counter bearing, thus simplifying the mounting. Furthermore, a force that presses the domed surface of the actuator unit and the conical bearing surface of the counter bearing together does not act along the actuator unit, so that this force need not be considered during the designing of the actuator unit.

According to an embodiment, a guide bush can be provided with a continuous recess in which the actuator unit is guided. According to an embodiment, the actuator unit can be moved axially in the guide bush. According to an embodiment, the guide bush can be designed in an advantageous way so that the contact surface between the guide bush and the actuator unit is small, and the friction is less. According to an embodiment, the actuator unit can be guided in the guide bush, with very little friction, by adjusting the actuator unit in the counter bearing, which reduces the danger of skewed adjustment of the actuator unit. According to an embodiment, in addition to the counter bearing and the guide bush, other guide elements for the actuator unit can be omitted so that no further friction occurs. Thereby, lift losses and wear can be avoided or reduced. The actuator unit is preferably guided in an area of the axial end facing away from the output. Thereby, the distance between the counter bearing and the area in which the actuator unit is guided is especially large, so that the low-friction alignment of the actuator unit is especially reliable.

According to an embodiment, the guide bush can be made up of sintered bronze, containing molybdenum sulfide. The advantage is that sintered bronze has a thermal expansion coefficient similar to that of steel, of which the area of the actuator unit, which guides in the guide bush, can be made up. According to an embodiment, the guide quality of the actuator unit in the guide bush can, therefore, be largely independent of the temperature. The molybdenum sulfide reduces the friction and thus the wear, and improves the dry running properties of the guide bush. Such a guide bush can be manufactured easily and inexpensively.

According to an embodiment, the actuator unit may comprise a compensating element, which is coupled to the actuator in the axial direction. According to an embodiment, such a compensating element can be designed especially to compensate the temperature-dependent axial linear expansions. Piezoactuators exhibit a different thermal expansion coefficient than that of steel, so that the different temperature-dependent axial linear expansions, such as those of the piezoactuator and a steel casing, can be compensated. This enables a temperature-independent lift of the lifting apparatus.

According to an embodiment, the compensating element and the actuator can be connected positively to each other. Such a positive connection can reduce lift losses by the deflection of contact between the compensating element and actuator, so that the contact is very rigid. Furthermore, according to an embodiment, the compensating element and the actuator can be aligned exactly to each other on a common axis for example. Thus, it is possible to avoid losses due to friction which can be caused due to a skewed guiding of the actuator unit.

According to an embodiment, it can be an advantage if the compensating element and the actuator are connected with each other by pressing. Such a connection is very robust and enables a very precise alignment of the compensating element and the actuator to one another. Furthermore, this connection is very rigid so that lift losses due to the deflection of the contact between the actuator and the compensating element can be avoided.

According to an embodiment, an injection valve may comprises a lifting apparatus and a nozzle needle. According to an embodiment, the nozzle needle can be coupled to the lifting apparatus on the output side and may prevent the flow of liquid through the injector nozzle when closed and, otherwise may releases it. Such an injection valve has the advantage that the lift of the nozzle needle is very reliable, so that the liquid to be injected is dosed in a reliable way.

FIG. 1 shows an injection valve, used in particular for combustion engines in motor vehicles. The injection valve has an injector casing (1) in which a bore (2) is formed and a connection (3) coupled with the bore (2) through which the fuel can be fed to the injection valve. The injection valve comprises, furthermore, a nozzle needle (4), which closes an injector nozzle (5) in the closed position or, otherwise, allows the flow of fuel through the injector nozzle (5). The injection valve furthermore comprises a lifting apparatus with an actuator unit comprising an actuator (6) and a compensating element (7), which are coupled to each other in the axial direction. The actuator (6) is, for example, a piezoactuator. The lift of the lifting apparatus is dependent on the axial expansion of the actuator (6), which is dependent on the actuating signal. The lifting apparatus is coupled to the nozzle needle (4) and works together with the nozzle needle (4) so that the lift of the lifting apparatus is transferred to the nozzle needle (4) and that the nozzle needle (4) is moved to either its closed position or to an open position.

Figure 2:
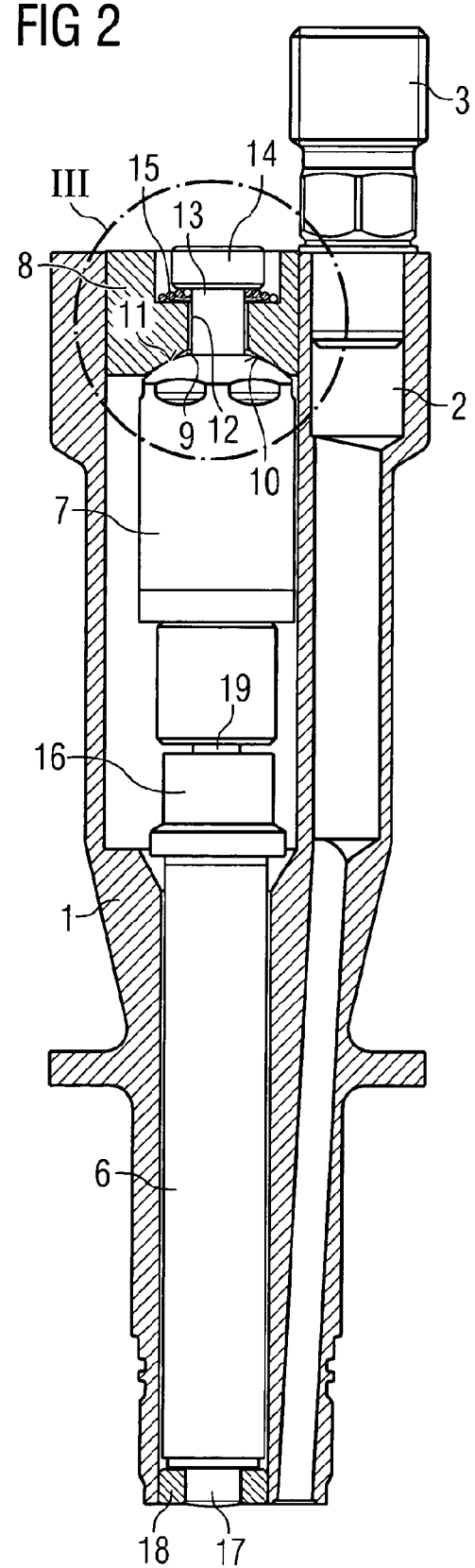
FIG. 2: a lifting apparatus
Figure 3:
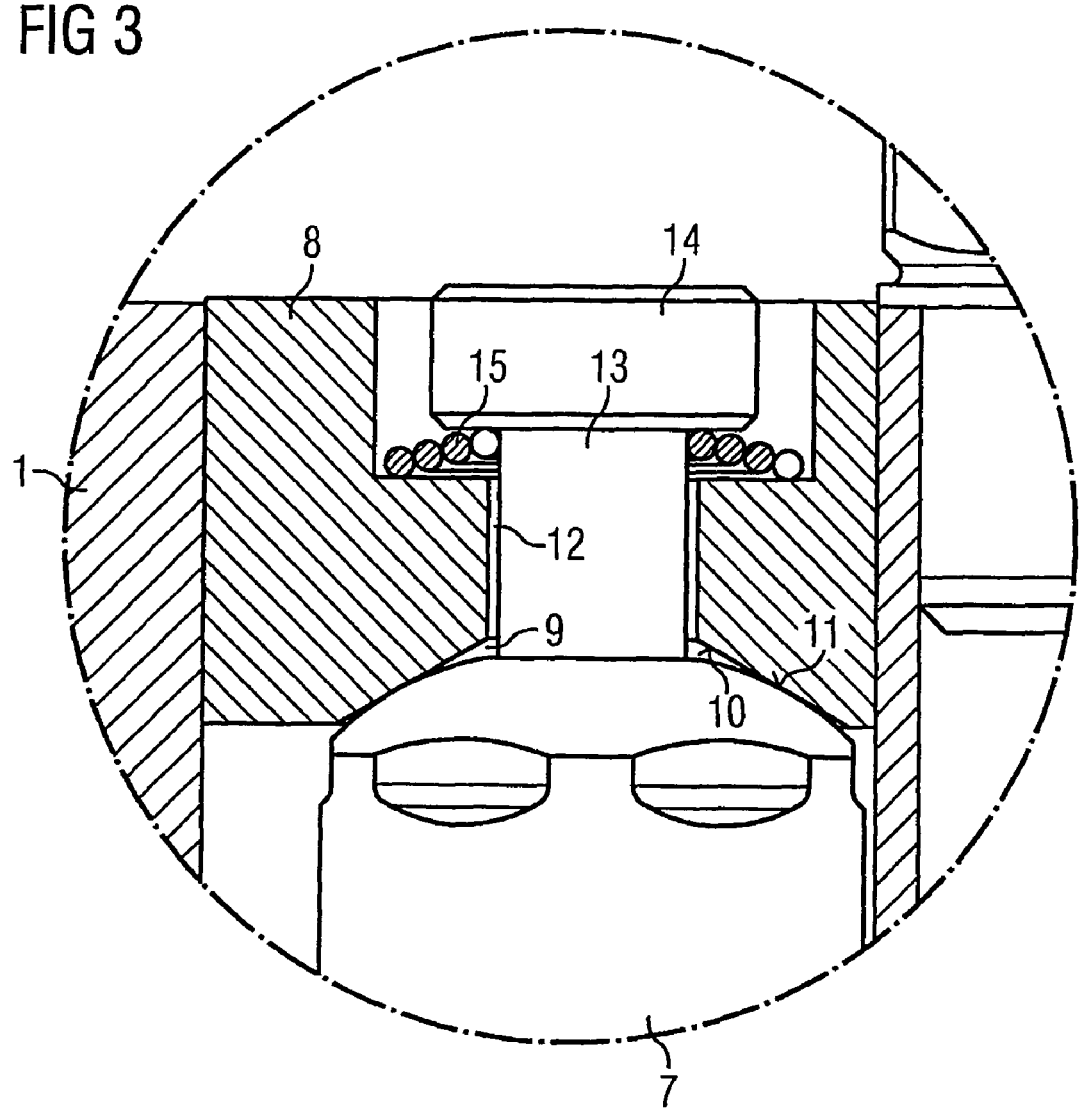
FIG. 3: a section of the lifting apparatus according to FIG. 2.

FIG. 2 shows a lifting apparatus and FIG. 3 shows an enlarged section of the lifting apparatus shown in FIG. 2. The lifting apparatus is arranged in the injector casing (1) and comprises a counter bearing (8) provided with a first recess (9) in which a conical bearing surface (10) is formed. The compensating element (7) has a domed surface (11) in an area of the actuator unit that faces away from the output, with which the compensating element (7) rests upon the conical bearing surface (10) of the counter bearing (8). The compensating element (7) is arranged to rotate in the counter bearing (8) and is arranged to be movable in its angular position, which means that the compensating element (7) can be rotated on its longitudinal axis in the counter bearing (8) and the compensating element (7) can be moved in the counter bearing (8) so that its longitudinal axis can be deflected against the conical axis of the conical bearing surface (10), so that the angle between the longitudinal axis of the compensating element (7) and that of the conical axis can be changed. The domed surface (11) can be designed, for example, either spherical or ball-shaped or it can be rounded so that a contact between the domed surface (11) and the conical bearing surface (10) is linear. The compensating element (7) is, for example, a hydraulic temperature compensator.

The counter bearing (8) has a second recess (12) through which a rod-shaped neck element (13) stretches. This element is coupled to the compensating element (7). The neck element (13) is arranged, preferably in the radial direction, at a distance from the wall of the second recess (12). This enables the alignment of the compensating element (7) in the counter bearing, (8) with respect to its angular position. A head element (14) is arranged on an axial end of the neck element (13) on the side of the counter bearing (8) facing away from the compensating element (7). The head element (14) is, for example, a nut, which can be screwed on the axial end of the neck element (13), or a ring, which is pressed on the axial end of the neck element (13). An elastic element (15) is arranged in the shape of a conical spring between the head element (14) and the counter bearing (8), and preloads the contact between the domed surface (11) and the conical bearing surface (10). Therefore, the danger of a deflection of contact is reduced, and thus, lift loss is avoided. However, an elastic suspension of the actuator unit on the counter bearing (8) allows alignment of the angular position and a rotary alignment of the actuator unit in the counter bearing (8).

The actuator (6) comprises an actuator cap (16) and a cap (17) on the output side. The actuator cap 16 is arranged on the axial end of the actuator (6) that faces away from the output. The actuator (6) is preferably guided in an axially movable way in a guide bush (18) in an area of the cap (17) on the output side.

Preferably, the actuator (6) and the compensating element (7) are connected positively to each other. For this, a coupling rod (19) is provided, which can be designed as a single piece together with the compensating element (7) or with the actuator cap (16), or can be pressed into the compensating element (7) or the actuator cap (16). Likewise, the actuator (6) and the compensating element (7) can be connected to each other by screwing, welding, or gluing. A particularly advantageous connection fixes the actuator (6) and the compensating element (7) reliably to each other, with low distortion, in such a way that the actuator (6) and the compensating element (7) have a common longitudinal axis. Thus, undesired friction and lift losses, in which for example the compensating element (7) or the actuator 6 come in contact with the wall of the injector body (1) or the actuator (6) is guided askew in the guide bush (18), can be prevented.

The guide bush 18 is preferably manufactured from a material such that it allows guiding of actuator 6 with low friction, especially even over the temperature range that occurs during working. If, for example, the cap (17) on the output side is made of steel, then, it is advantageous to manufacture the guide bush (18) from sintered bronze, since sintered bronze exhibits a thermal expansion coefficient of similar size to that of steel. Furthermore, it is advantageous to add molybdenum sulfide to sintered bronze, since it can improve the properties of the guide bush (18) with regard to friction and abrasion. The guide bush (18) can be made of another material, for example Teflon.

The neck element (13) and the head element (14) can be designed as a single piece, for example as a screw, and can be screwed into the compensating element (7). Likewise, the neck element (13) can be connected to the compensating element (7) by gluing, welding or by pressing. A thread or a groove can be designed in the neck element (13). In place of the head element (14), a lock washer or a spring washer can be pressed on to the neck element (13) or can be arranged in the groove. Alternatively, a retaining clip can also be provided, or a retaining washer for axles or shafts. As an alternative to the conical spring that forms the elastic element (15), another spring or a lock washer or a spring washer can likewise be provided.

The actuator (6) and the compensating element (7) can also be otherwise arranged in the actuator unit, e.g. interchanged in the axial direction. Thus, the domed surface (11) can be designed on the actuator (6), e.g. on the actuator cap (16) and rest on the conical bearing surface (10) of the counter bearing (8). Accordingly, the neck element (13) is coupled to the actuator (6) and the compensating element (7) can be guided in the guide bush (18).

Only a few small contact surfaces are provided in the lifting apparatus, so that the lifting apparatus can be operated with low friction and low abrasion. Furthermore, the lifting apparatus has only a few contact points along the power train, at which a lift loss can occur due to the deflection of the contact. The self-adjusting alignment of the actuator unit in the lifting apparatus makes it possible to operate with low friction and low wear. The injection valve with this lifting apparatus can be provided with a continuously reliable lift of the nozzle needle (4) so that the fuel can be reliably injected into the combustion chamber of a combustion engine.

The lifting apparatus need not necessarily be used only in injection valves for combustion engines, but also in other valves or other devices in which a lift must be transmitted in a reliable way.

What is claimed is:

1. A lifting apparatus, comprising:
a counter bearing comprising a first recess having a conical bearing surface, and
an actuator unit, comprising an actuator, an axial extension of which is dependent on an actuating signal, the actuator unit having a shoulder formed in an area of the actuator unit facing away from the output, the shoulder having a domed surface, and the domed surface of the actuator unit remains pressed upon the conical bearing surface of the counter bearing regardless of any axial extension or contraction of the actuator,
wherein the lifting apparatus has a guide bush with a continuous recess, in which the actuator unit is guided and in which the actuator unit is arranged in such a way that it can be moved axially and the guide bush is made of sintered bronze with molybdenum sulfide.

2. The lifting apparatus according to claim 1, comprising an elastic element designed in such a way and working together with the actuator unit in such a way that the domed surface is in contact with the conical bearing surface.

3. The lifting apparatus according to claim 2, wherein the actuator unit comprises a neck element that stretches through a second recess, which is formed in the counter bearing and penetrates it, and the neck element is provided with a head element on the side of the counter bearing facing away from the actuator unit, and the elastic element is arranged between the head element and the counter bearing.

4. The lifting apparatus according to claim 1, wherein the actuator unit comprises a compensating element which is coupled to the actuator in the axial direction.

5. The lifting apparatus according to claim 4, wherein the compensating element and the actuator are connected positively to each other.

6. The lifting apparatus according to claim 5, wherein the compensating element and the actuator are connected to each other by pressing.

7. An injection valve, comprising
a lifting apparatus according to claim 1, and
an nozzle needle coupled to the lifting apparatus on an output side, which prevents a flow of liquid through the injector nozzle when closed and otherwise releases the flow.

* * * * *